US012641724B2

(12) United States Patent
Li

(10) Patent No.: US 12,641,724 B2
(45) Date of Patent: May 26, 2026

(54) CIRCUIT BOARD, DISPLAY APPARATUS, AND METHOD FOR MANUFACTURING CIRCUIT BOARD

(71) Applicants: Chengdu BOE Optoelectronics Technology Co., Ltd., Chengdu (CN); BOE Technology Group Co., Ltd., Beijing (CN)

(72) Inventor: Fan Li, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 335 days.

(21) Appl. No.: 18/284,781

(22) PCT Filed: Jan. 6, 2023

(86) PCT No.: PCT/CN2023/070893
§ 371 (c)(1),
(2) Date: Sep. 28, 2023

(87) PCT Pub. No.: WO2023/142965
PCT Pub. Date: Aug. 3, 2023

(65) Prior Publication Data
US 2024/0172364 A1      May 23, 2024

(30) Foreign Application Priority Data

Jan. 29, 2022    (CN) .......................... 202210113050.5

(51) Int. Cl.
H05K 1/14          (2006.01)
H05K 1/02          (2006.01)
(Continued)

(52) U.S. Cl.
CPC ............. *H05K 1/144* (2013.01); *H05K 1/028* (2013.01); *H05K 1/115* (2013.01); *H10K 59/131* (2023.02);
(Continued)

(58) Field of Classification Search
CPC ...... H10K 59/131; H10K 59/40; H05K 1/144; H05K 1/028; H05K 1/115; H05K 2201/10128; H05K 2201/10734
(Continued)

(56) References Cited

U.S. PATENT DOCUMENTS

2016/0037638 A1     2/2016  Inamori et al.
2021/0191201 A1     6/2021  Sun et al.
(Continued)

FOREIGN PATENT DOCUMENTS

CN        205566796 U      9/2016
CN        210983365 U      7/2020
(Continued)

OTHER PUBLICATIONS

CN202210113050.5 First office action dated Feb. 2, 2026.

*Primary Examiner* — Igwe U Anya
(74) *Attorney, Agent, or Firm* — IPro, PLLC

(57) ABSTRACT

Disclosed is a circuit board, including: a first circuit board, a second circuit board and a conductive portion. The first circuit board includes a first substrate, a wire group and a substrate connection pad. A first wire group includes a first wire and a second wire disposed on two sides of the first substrate. A first substrate connection pad is electrically connected to the second wire via a via hole. The second circuit board includes a second substrate, a wire and a relay connection pad, wherein the wire and the relay connection pad are disposed on the second substrate. One end of the wire is electrically connected to a first relay connection pad.

20 Claims, 10 Drawing Sheets

(51) Int. Cl.

| | | |
|---|---|---|
| *H05K 1/11* | (2006.01) | |
| *H10K 59/131* | (2023.01) | |
| *H10K 59/40* | (2023.01) | |

(52) U.S. Cl.
CPC ... *H10K 59/40* (2023.02); *H05K 2201/10128* (2013.01); *H05K 2201/10734* (2013.01)

(58) Field of Classification Search
USPC .......................................................... 257/40
See application file for complete search history.

(56) References Cited

U.S. PATENT DOCUMENTS

| | | | | |
|---|---|---|---|---|
| 2021/0282265 A1* | 9/2021 | Jung | ..................... | H05K 1/113 |
| 2022/0201858 A1* | 6/2022 | Xiong | .................... | H05K 3/363 |
| 2022/0256706 A1* | 8/2022 | Xiong | ................ | G06F 3/04164 |

FOREIGN PATENT DOCUMENTS

| | | |
|---|---|---|
| CN | 212259446 U | 12/2020 |
| CN | 113301710 A | 8/2021 |
| CN | 113514989 A | 10/2021 |
| CN | 214960285 U | 11/2021 |
| CN | 114072758 A | 2/2022 |
| CN | 217037552 U | 7/2022 |
| KR | 20190074101 A | 6/2019 |
| WO | 2019131286 A1 | 7/2019 |

* cited by examiner

01

02 p1

Soldering tin

Relay circuit
board

Main circuit
board p2

Relay circuit
board

Soldering tin

Main circuit
board

CIRCUIT BOARD, DISPLAY APPARATUS, AND METHOD FOR MANUFACTURING CIRCUIT BOARD

CROSS-REFERENCE TO RELATED APPLICATIONS

This application is a U.S. national stage of international application No. PCT/CN2023/070893, filed on Jan. 6, 2023, which claims priority to Chinese Patent Application No. 202210113050.5, filed on Jan. 29, 2022, and entitled "CIRCUIT BOARD, DISPLAY APPARATUS, AND FABRICATION METHOD FOR CIRCUIT BOARD", the disclosures of which are herein incorporated by reference in their entireties.

TECHNICAL FIELD

The present disclosure relates to the field of display technologies, and in particular, relates to a circuit board, a display apparatus and a method for manufacturing the circuit board.

BACKGROUND

A circuit board bonded with a display panel is connected to a display signal source, such that a display drive signal is introduced into the display panel through a wire in the circuit board. For a display panel with a touch function, the circuit board is able to transmit a touch signal, such that the number of wires in the circuit board is further increased.

SUMMARY

Embodiments of the present disclosure provide a circuit board, a display apparatus and a method for manufacturing the circuit board.

According to some embodiments of the present disclosure, a circuit board is provided. The circuit board includes a first circuit board, at least one second circuit board and at least one conductive portion, wherein the first circuit board includes a first substrate, at least one wire group and at least one substrate connection pad, wherein a first wire group in the at least one wire group includes a first wire disposed on a first side of the first substrate and a second wire disposed on a second side of the first substrate, the at least one substrate connection pad is disposed on the first side of the first substrate, the first wire is electrically connected to a first substrate connection pad in the at least one substrate connection pad, the first substrate is provided with a first via hole, the first substrate connection pad is electrically connected to the second wire via the first via hole, and the first side and the second side are two opposite sides of the first substrate; and the second circuit board includes a second substrate, at least two wires and at least one relay connection pad, wherein the least two wires and the at least one relay connection pad are disposed on the second substrate, the second substrate is disposed on the first side of the first substrate, one end of each of the at least two wires is electrically connected to a first relay connection pad in the at least one relay connection pad, and the first relay connection pad is electrically connected to the first substrate connection pad via a first conductive portion in the at least one conductive portion.

In some embodiments, the first substrate connection pad includes at least two substrate connection terminals disposed on the first side of the first substrate; wherein the at least two substrate connection terminals include a first substrate connection terminal electrically connected to the first wire, and a second substrate connection terminal disposed at the first via hole, the second substrate connection terminal being electrically connected to the second wire.

In some embodiments, the second substrate connection terminal includes a conductive structure surrounding the first via hole and a metal layer covering the conductive structure and the first via hole, wherein the conductive structure is disposed on the first substrate, and the conductive structure and the first wire are at the same layer.

In some embodiments, the at least two wires include a third wire disposed on a third side of the second substrate and a fourth wire disposed on a fourth side of the second substrate, wherein the third side and the fourth side are two opposite sides of the second substrate, and the third side is a side of the second substrate facing the first substrate; and the second substrate is provided with a second via hole, wherein the first relay connection pad is electrically connected to the fourth wire via the second via hole.

In some embodiments, the second via hole has a number of at least two; the first relay connection pad includes relay connection terminals disposed at the second via holes; and the third wire and the fourth wire are respectively electrically connected to two of the relay connection terminals at the second via holes.

In some embodiments, each of the relay connection terminals includes a first conductive layer disposed on a hole wall of the second via hole, and second conductive layers extending from openings of the second via hole to the second substrate, the first conductive layer being connected to the second conductive layers.

In some embodiments, the first conductive portion is in contact with the first substrate connection pad, and the first conductive portion is at least partially filled in the second via hole.

In some embodiments, the at least two wires include a fifth wire disposed on a third side of the second substrate or a fourth side of the second substrate; wherein the third side and the fourth side are two opposite sides of the second substrate, the third side is a side of the second substrate facing the first substrate, and the fifth wire is electrically connected to the first relay connection pad.

In some embodiments, the wire group has a number of at least two; and the conductive portion has a number of at least two;

The first circuit board further includes a second substrate connection pad disposed on the first substrate, a second wire group in the at least two wire groups includes a sixth wire disposed on the first side of the first substrate and a seventh wire disposed on the second side of the first substrate, wherein the sixth wire is electrically connected to the second substrate connection pad, the first substrate is provided with a third via hole, and the seventh wire is electrically connected to the second substrate connection pad via the third via hole; and the second circuit board further includes a second relay connection pad disposed on the second substrate, wherein the other end of each of the at least two wires is electrically connected to the second relay connection pad, and the second relay connection pad is electrically connected to the second substrate connection pad via a second conductive portion in the at least two conductive portions.

In some embodiments, the first circuit board includes a first insulation layer disposed on the first side of the first substrate, and an eighth wire disposed between the first insulation layer and the first substrate, wherein the first insulation layer is provided with a fourth via hole, and the eighth wire is electrically connected to the first substrate connection pad via the fourth via hole.

In some embodiments, at least one of the substrate connection pad and the relay connection pad is a ball-grid-array connection pad.

In some embodiments, the first substrate and the second substrate are both flexible substrates.

According to some embodiments of the present disclosure, a display apparatus is provided. The display apparatus includes a display panel and any one of the circuit boards as defined in the above aspect, wherein the display panel is electrically connected to the circuit board.

In some embodiments, the display panel includes a base substrate, a light-emitting structure layer disposed on the base substrate, and a touch electrode layer disposed on the light-emitting structure layer, wherein the touch electrode layer is electrically connected to the circuit board.

According to some embodiments of the present disclosure, a method for manufacturing the circuit board is provided. The method includes:

providing a first circuit board, wherein the first circuit board includes a first substrate, at least one wire group and at least one substrate connection pad, wherein a first wire group in the at least one wire group includes a first wire disposed on a first side of the first substrate and a second wire disposed on a second side of the first substrate, the at least one substrate connection pad is disposed on the first side of the first substrate, the first wire is electrically connected to a first substrate connection pad in the at least one substrate connection pad, the first substrate is provided with a first via hole, the first substrate connection pad is electrically connected to the second wire via the first via hole, and the first side and the second side are two opposite sides of the first substrate;

providing a second circuit board, wherein the second circuit board includes a second substrate, at least two wires and at least one relay connection pad, wherein the least two wires and the at least one relay connection pad are disposed on the second substrate, and one end of each of the at least two wires is electrically connected to the first relay connection pad in the at least one relay connection pad; and stacking the second circuit board on the first circuit board, and electrically connecting the first relay connection pad to the first substrate connection pad via at least one conductive portion, wherein the second substrate is disposed on the first side of the first substrate.

BRIEF DESCRIPTION OF DRAWINGS

For clearer illustration of the technical solutions in the embodiments of the present disclosure, accompanying drawings required for describing the embodiments are briefly introduced hereinafter. Apparently, the accompanying drawings described hereinafter merely illustrate some embodiments of the present disclosure, and a person of ordinary skill in the art may derive other drawings from these accompanying drawings without creative efforts.

4

Figure 2:
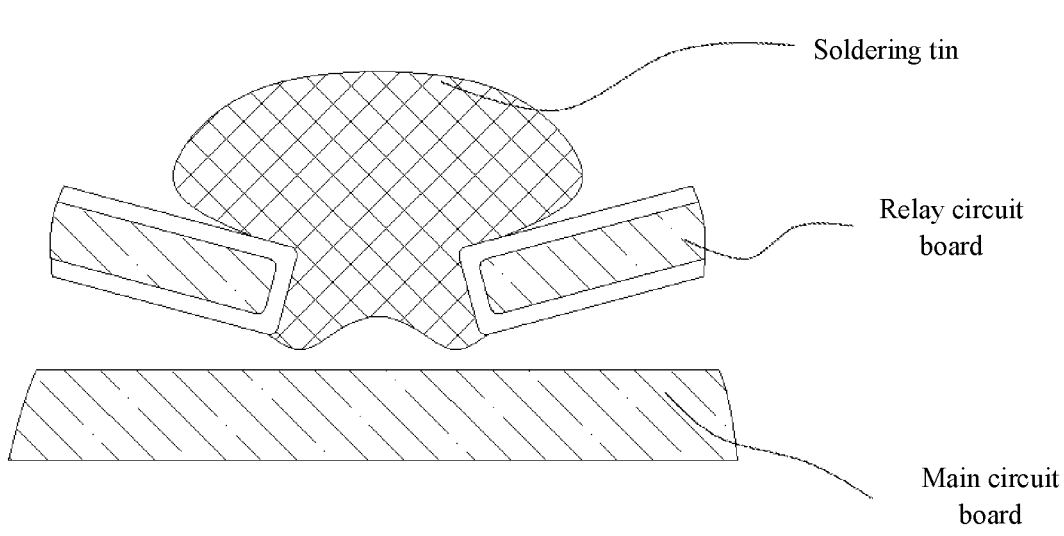
Figure 3:
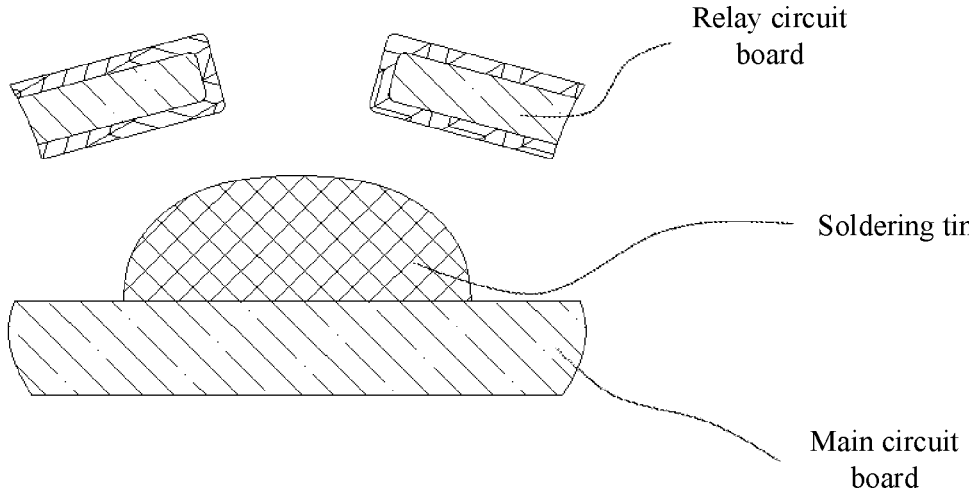
Figure 4:
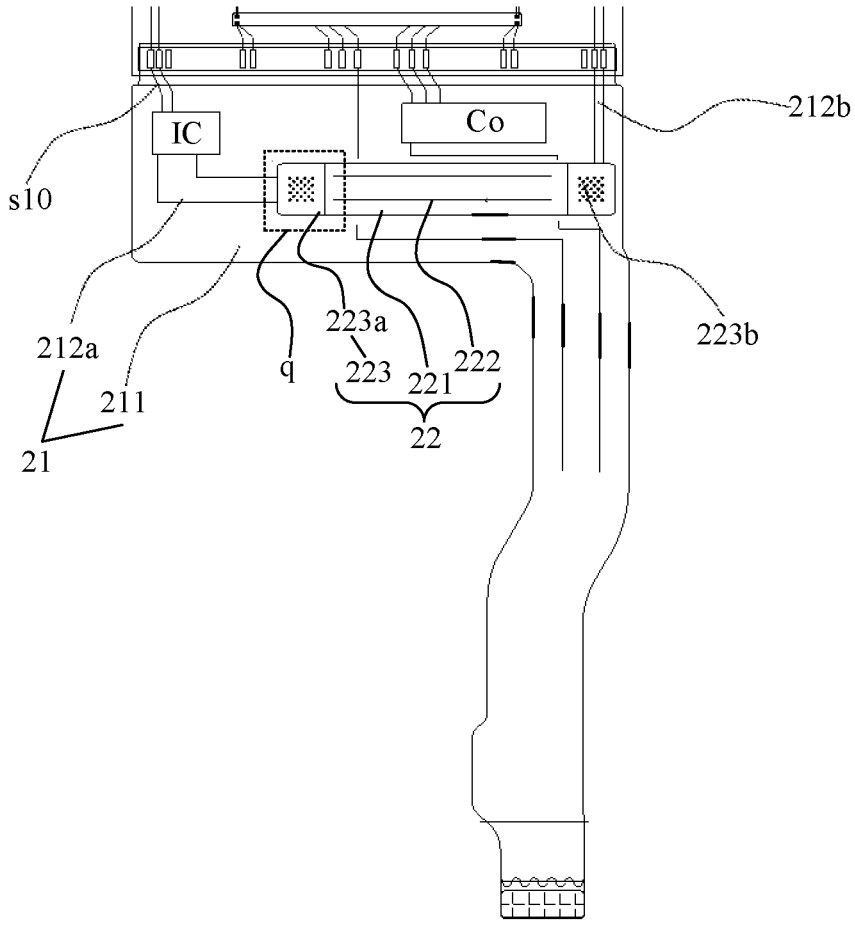
Figure 5:
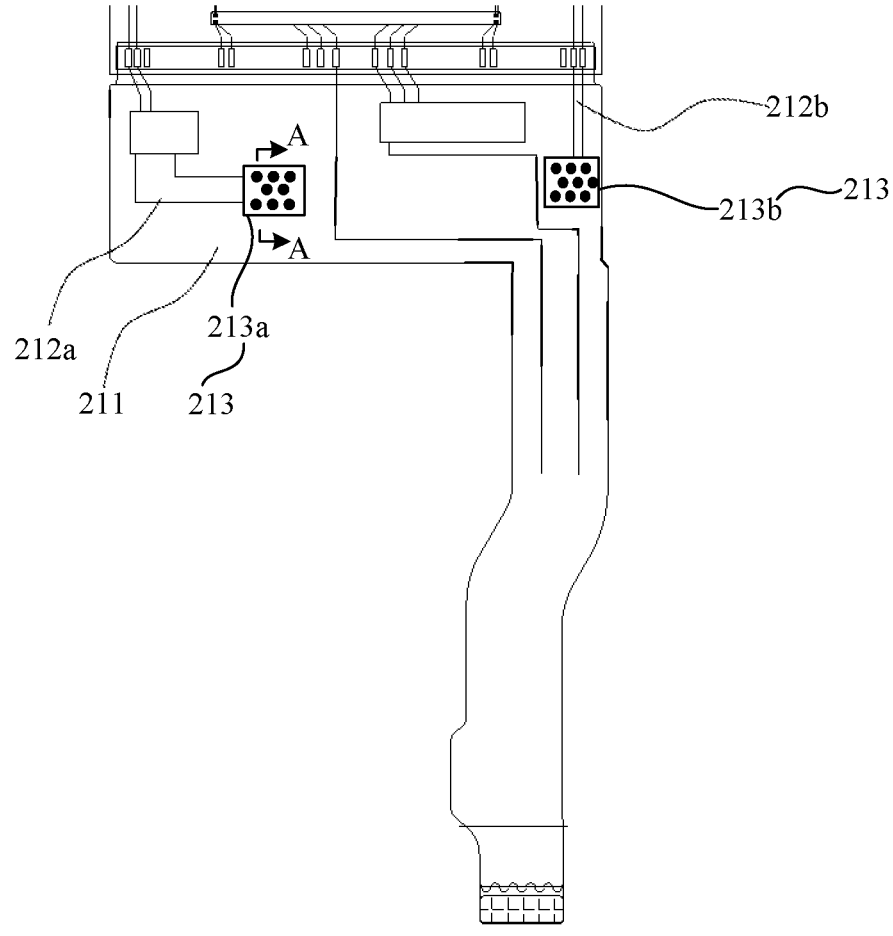
Figure 6:
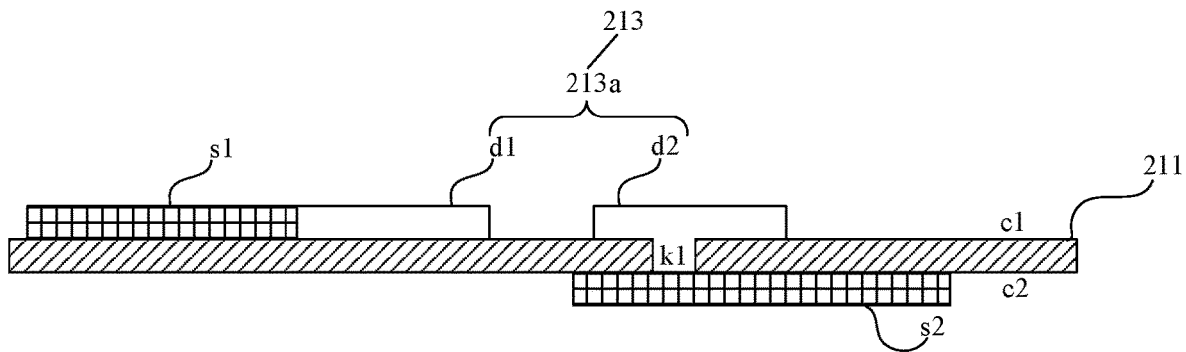
Figure 7:
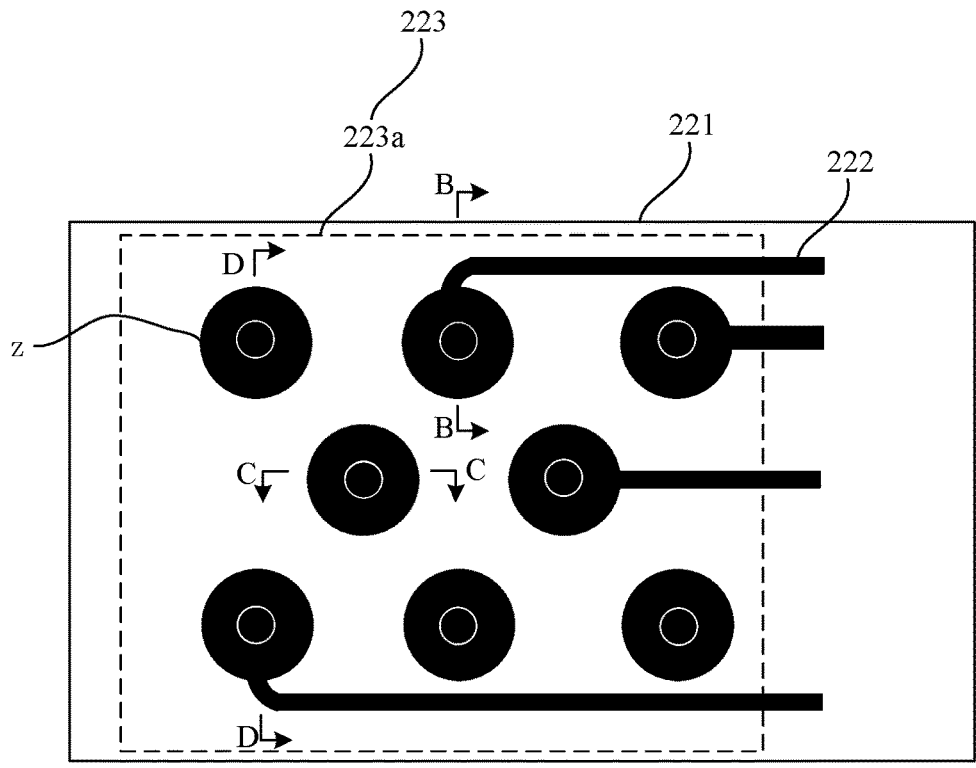
Figure 8:
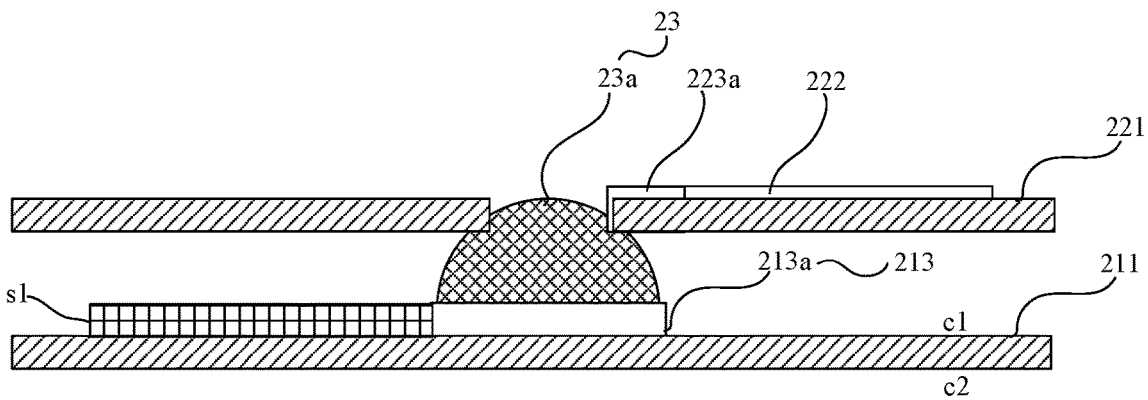
Figure 9:
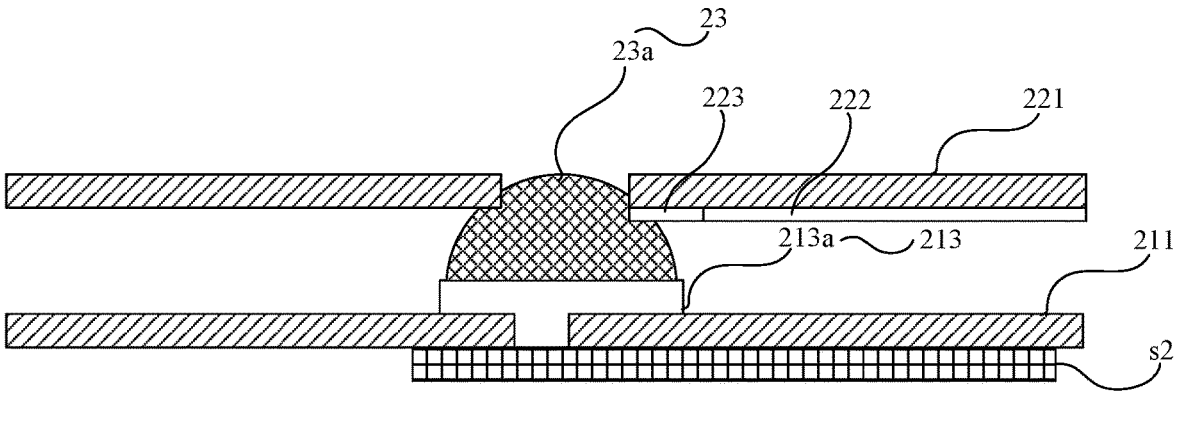
Figure 10:
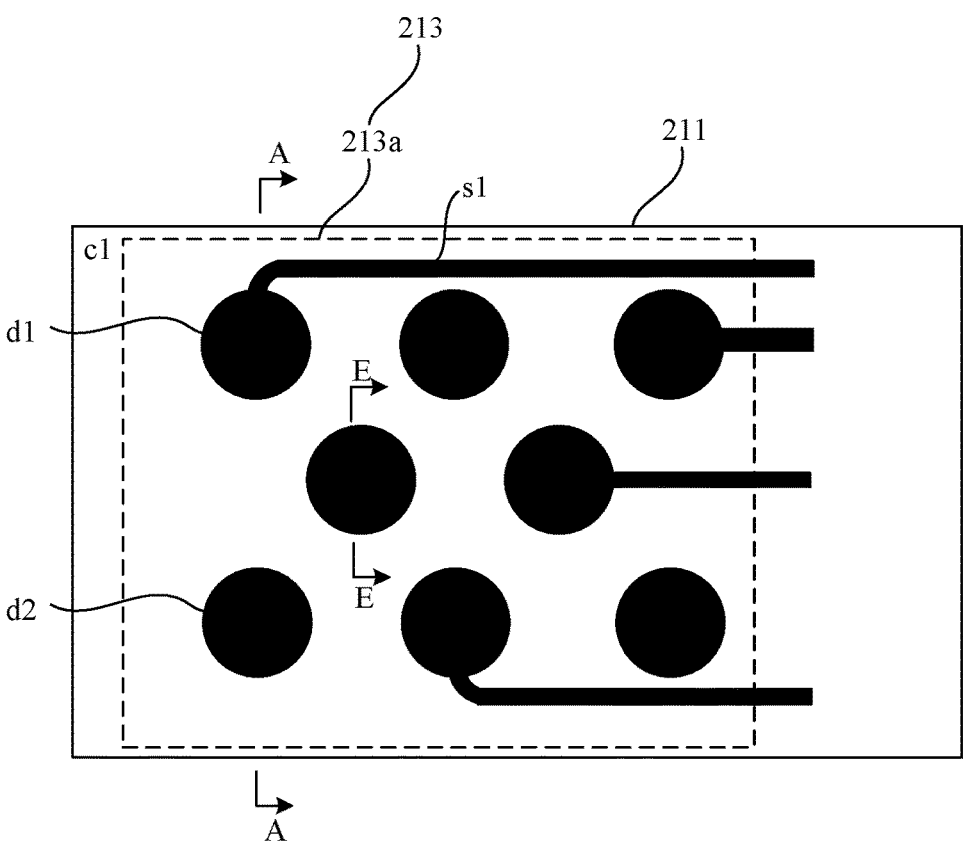
Figure 11:
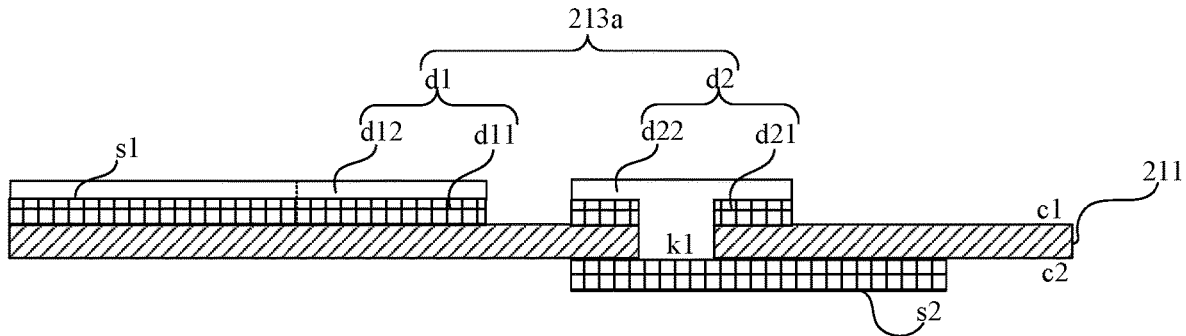
Figure 12:
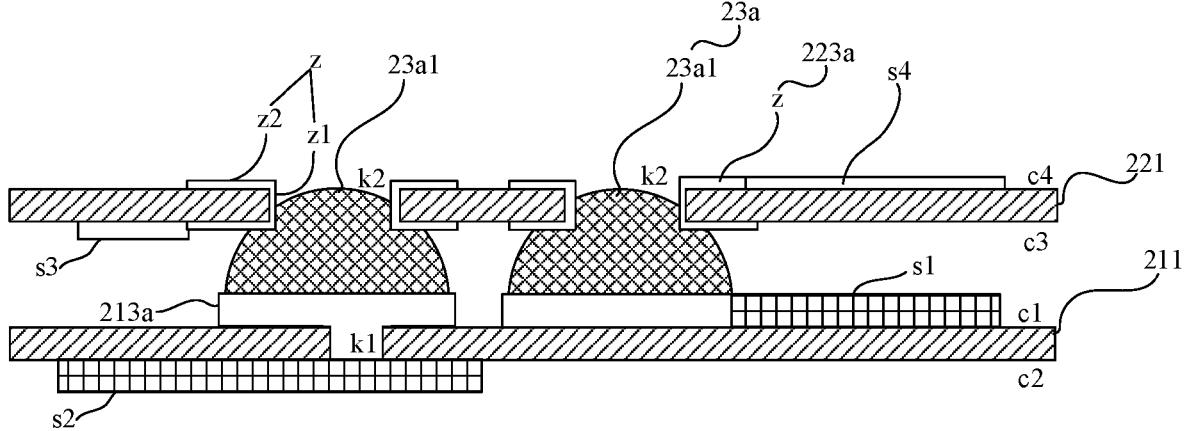
Figure 13:
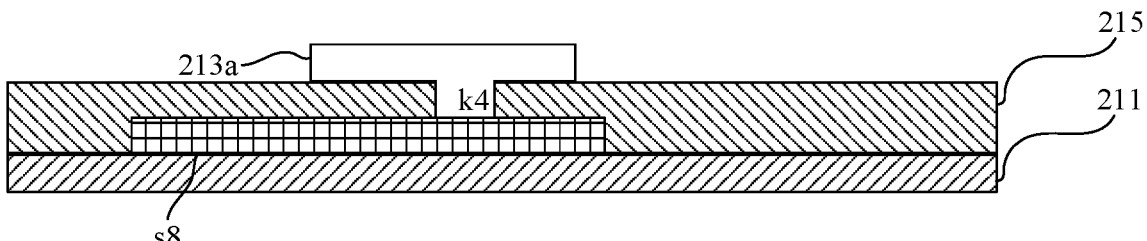
Figure 14:
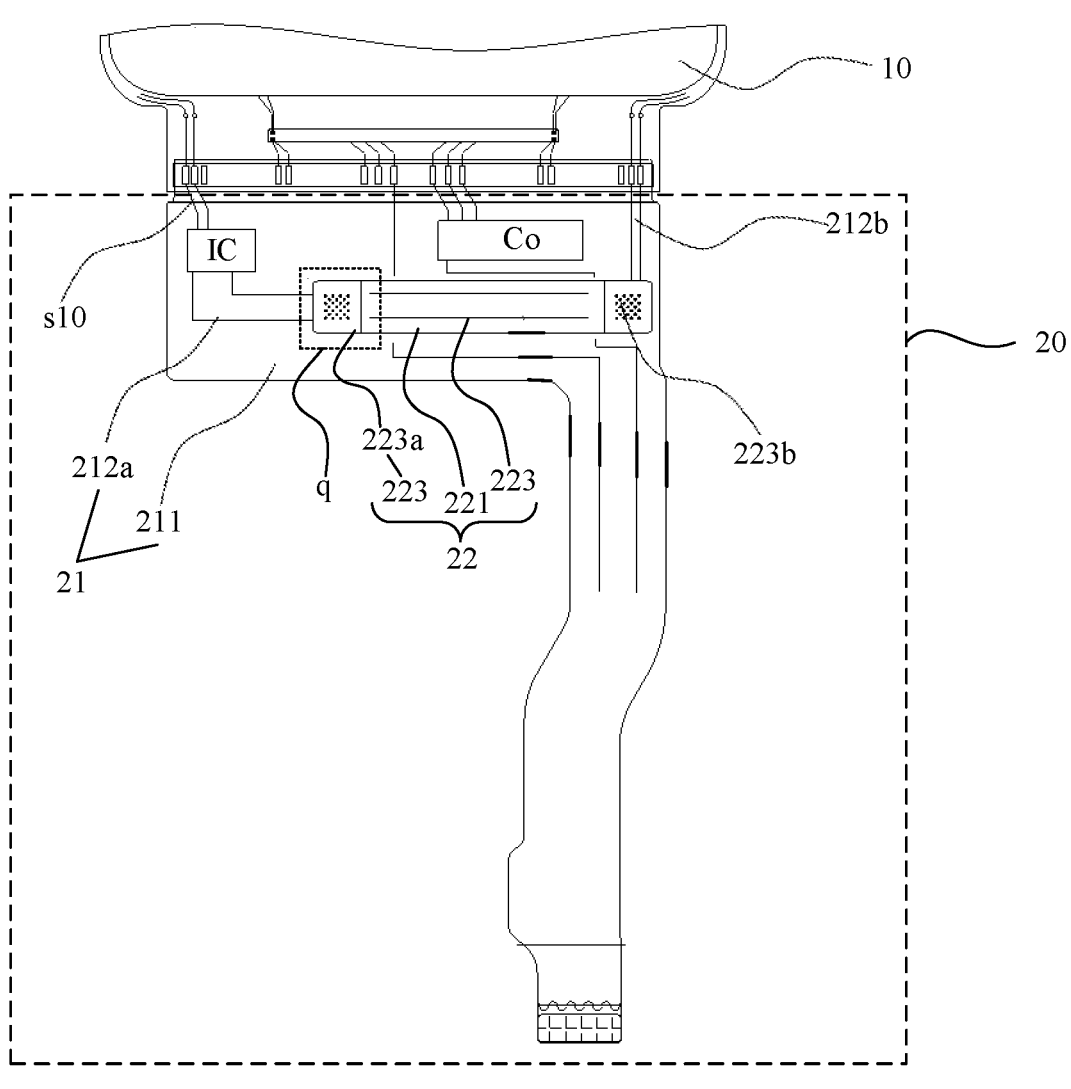
Figure 15:
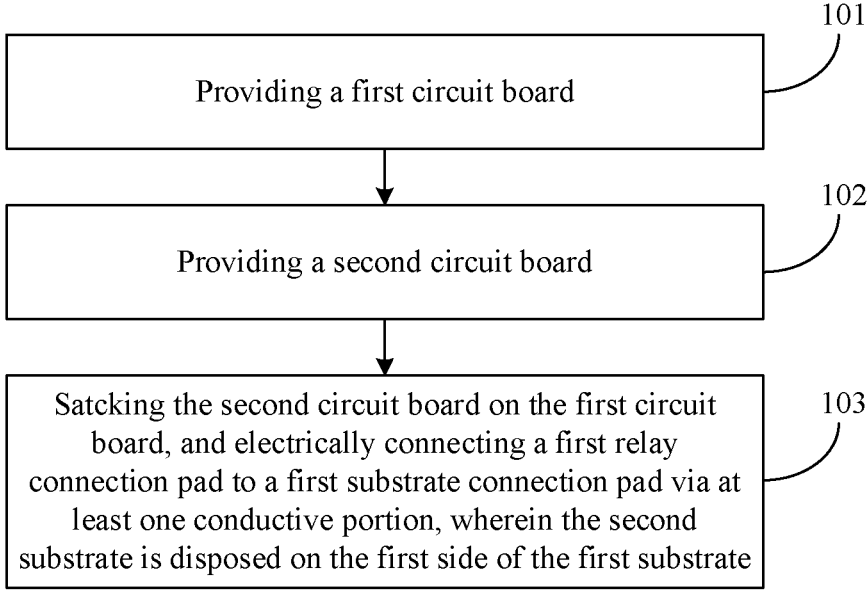

FIG. 2 is a schematic diagram of a structure of a circuit board failure;

FIG. 3 is a schematic diagram of a structure of another circuit board failure;

FIG. 4 is a schematic diagram of a structure of a circuit board according to some embodiments of the present disclosure;

FIG. 5 is a schematic diagram of a structure of a first circuit board in the circuit board shown in FIG. 4;

FIG. 6 is a schematic diagram of a sectional structure taken at a sectional position A-A of the first circuit board shown in FIG. 5;

FIG. 7 is a partially enlarged schematic diagram of the structure of the circuit board shown in FIG. 4;

FIG. 8 is a schematic diagram of a sectional structure taken at a sectional position B-B of a first relay connection pad shown in FIG. 7;

FIG. 9 is a schematic diagram of a sectional structure taken at another sectional position C-C of the first relay connection pad shown in FIG. 7;

FIG. 10 is a schematic diagram of a structure of a first substrate connection pad in the first circuit board shown in FIG. 5;

FIG. 11 is a schematic diagram of a sectional structure taken at another sectional position A-A of the first substrate connection pad shown in FIG. 10;

FIG. 12 is a schematic diagram of a sectional structure taken at a sectional position D-D of the structure shown in FIG. 7;

FIG. 13 is a schematic diagram of a sectional structure taken at another sectional position E-E of the structure shown in FIG. 10;

FIG. 14 is a schematic diagram of a structure of a display apparatus according to some embodiments of the present disclosure; and FIG. 15 is a flowchart of a method for manufacturing a circuit board according to some embodiments of the present disclosure.

The embodiments of the present disclosure have been illustrated explicitly through the accompanying drawings above, and the embodiments of the present disclosure will be described in further detail hereinafter. These accompanying drawings and text descriptions are not intended to limit scope of a conception of the present disclosure in any way, but to explain a concept of the present disclosure to those skilled in the art with reference to specific embodiments.

DETAILED DESCRIPTION

To describe the objectives, technical solutions, and advantages of the present disclosure more clearly, the embodiments of the present disclosure are further described in detail hereinafter in conjunction with the accompanying drawings.

In some embodiments, a display apparatus includes a display panel and a circuit board. The circuit board is provided with a plurality of wires, wherein the wires are electrically connected to the display panel to control the display panel to achieve various functions, such as a display function, a touch function or the like.

However, in a case that the number of wires in the circuit board is large, probability of wire crossing is increased. Then, how to layout this large number of wires has become an urgent problem to solve.

One of the currently available solutions is to arrange multiple layers of wires in the circuit board and arrange an insulation layer between every two adjacent layers of wires, such that layout of a large number of wires that may cross is achieved. However, this solution leads to a thicker circuit board, a complex manufacturing process, and a high cost.

Figure 1:
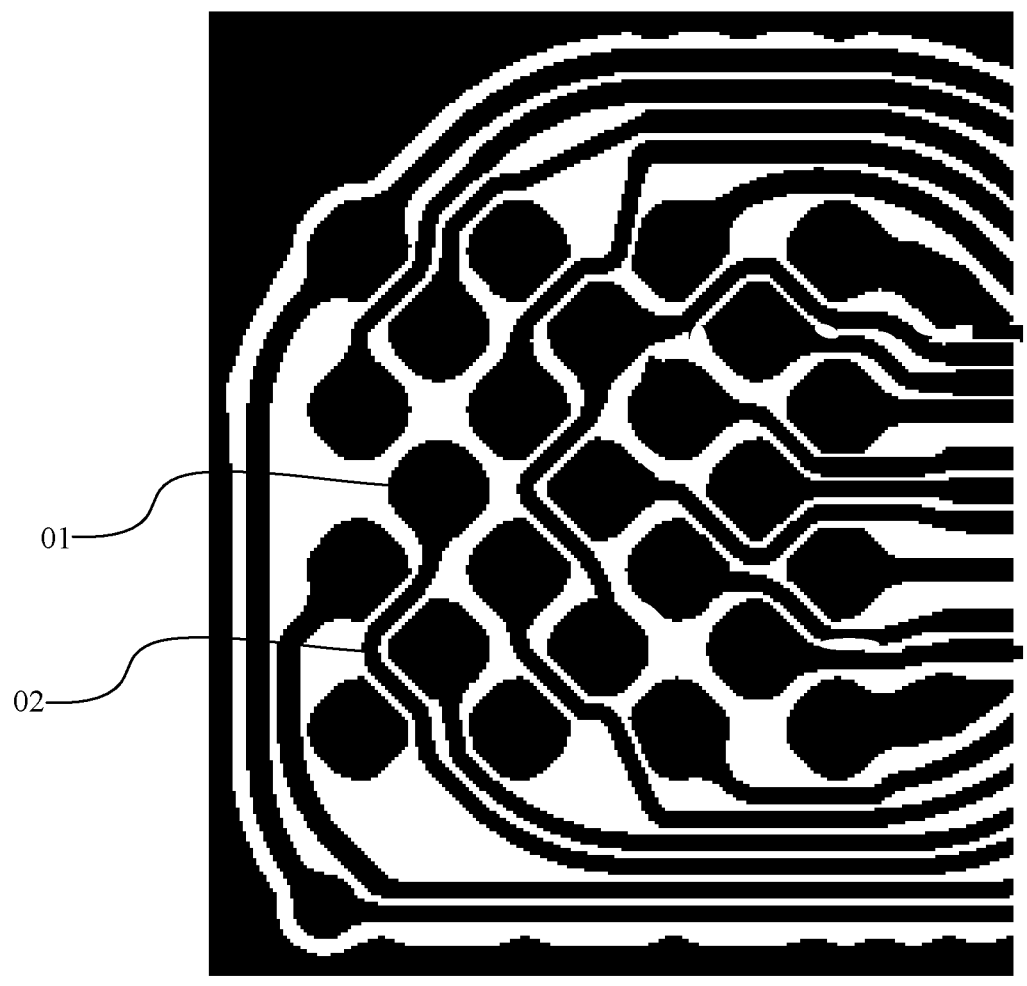
FIG. 1 is a schematic diagram of a structure of a bonding pad of a main circuit board.

Another solution is to connect circuits by bridging. In this solution, the circuit board includes one main circuit board and one relay circuit board. The main circuit board is provided with two bonding pads; the relay circuit board is also provided with two corresponding bonding pads; the relay circuit board is stacked on the main circuit board; and the two bonding pads of the relay circuit board and the two bonding pads on the main circuit board are correspondingly connected by soldering tin. A reference is made to FIG. 1 for the structure of the soldering pad of the main circuit board. FIG. 1 is a schematic diagram of a structure of a bonding pad of a main circuit board. The bonding pad is provided with a plurality of connection terminals 01, wherein the connection terminals 01 are arranged in a ball grid array and connected to wires 02. Referring to FIG. 1, the plurality of wires 02 occupies a lot of space on the soldering pad, such that the size of each connection terminal 01 is small. In order to avoid a short circuit between the soldering tin and the wires, space occupied by subsequently provided soldering tin is less, such that a robustness of the connection between the soldering tin and the main circuit board is reduced, and a robustness of the connection between the soldering tin and the relay circuit board is reduced, thereby possibility of occurrence of connection fault is increased. As shown in FIG. 2, FIG. 2 is a schematic diagram of a structure of a circuit board fault p1, wherein the soldering tin connected to the relay circuit board falls off from the main circuit board, which causes an open circuit between the main circuit board and the relay circuit board. As shown in FIG. 3, FIG. 3 is a schematic diagram of a structure of another circuit board fault p2, wherein the relay circuit board is separated from the soldering tin, resulting in an open circuit between the main circuit board and the relay circuit board. The faults p1 and p2 may occur when the main circuit board and the relay circuit board are deformed (such as under heating, or by collision, or during shaking), resulting in lower reliability of the circuit board and a display apparatus to which the circuit board is applied.

FIG. 4 is a schematic diagram of a structure of a circuit board according to some embodiments of the present disclosure. Refer to FIG. 4. The circuit board 20 includes a first circuit board 21, at least one second circuit board 22 and at least one conductive portion (not shown in FIG. 4).

FIG. 5 is a schematic diagram of a structure of the first circuit board in the circuit board shown in FIG. 4, and FIG. 6 is a schematic diagram of a sectional structure (at a sectional position A-A) of the first circuit board shown in FIG. 5. Referring to FIG. 5 and FIG. 6, the first circuit board includes a first substrate 211, at least one wire group and at least one substrate connection pad 213. A first wire group 212*a* in the at least one wire group includes a first wire s1 disposed on a first side c1 of the first substrate 211 and a second wire s2 disposed on a second side c2 of the first substrate 211. The at least one substrate connection pad 213 is disposed on the first side c1 of the first substrate 211. The first wire s1 is electrically connected to a first substrate connection pad 213*a* in the at least one substrate connection pad 213. The first substrate 211 is provided with a first via hole k1, and the first substrate connection pad 213*a* is electrically connected to the second wire s2 via the first via hole k1. The first side c1 and the second side c2 are two opposite sides of the first substrate 211.

Referring to FIG. 4, the second circuit board 22 includes a second substrate 221, at least two wires 222 and at least one relay connection pad 223, wherein the at least two wires

222 and the at least one relay connection pad 223 are disposed on the second substrate 221. The second substrate 221 is disposed on the first side of the first substrate 211. One end of each of the at least two wires 222 is electrically connected to the first relay connection pad 223*a* in the at least one relay connection pad 223.

FIG. 7 is a partially enlarged schematic diagram of a structure of the circuit board (a region q) shown in FIG. 4. Referring to FIG. 7, the second substrate 221 is provided with the first relay connection pad 223*a*, and one end of the wire 222 is electrically connected to the first relay connection pad 223*a*.

FIG. 8 is a schematic diagram of a sectional structure (at a sectional position B-B) of the first relay connection pad shown in FIG. 7. FIG. 8 shows a connection structure between the first wire s1 and the first substrate connection pad 213*a*. FIG. 9 is a schematic diagram of another sectional structure (at a sectional position C-C) of the first relay connection pad shown in FIG. 7. FIG. 9 shows a connection structure between the second wire s2 and the first substrate connection pad 213*a*.

The first relay connection pad 223 is electrically connected to the first substrate connection pad 213*a* via a first conductive portion 23*a* in the at least one conductive portion 23.

As shown in FIG. 7, FIG. 8 and FIG. 9, the first substrate connection pad 213*a* is connected to the wires disposed on both sides of the first substrate 211, and the number of wires on one side of the first substrate provided with the first substrate connection pad 213*a* is reduced, thereby reserving a larger space for the conductive portion. In such a way, the size of the conductive portion is larger, thereby increasing a robustness of the connection between the conductive portion and the first circuit board, as well as a robustness of the connection between the conductive portion and the second circuit board, and the conductive portion is less liable to separation from the first circuit board and the second circuit board. Possibility of occurrence of the failures shown in FIG. 2 and FIG. 3 is reduced and the reliability of the circuit board is greatly improved.

In summary, the embodiment of the present disclosure provides a circuit board, and wires on both sides of a first substrate of the circuit board are electrically connected to a substrate connection pad on the first substrate to reduce an area occupied by the wire on the side where the substrate connection pad on the first substrate is disposed, such that a larger area is left on the substrate connection pad for disposing the conductive portion. In such a way, the connection stability between the first circuit board and the second circuit board is improved, and the problem of low reliability of the circuit board in related technologies is solved, thereby improving the reliability of the circuit board.

FIG. 4 shows the case where the number of the second circuit board is 1, but the number of the second circuit board may be 2, 3, 4, 5, 6 or more, which is not limited in the embodiments of the present disclosure.

In addition, in some embodiments, the other end of each of the at least two wires in the second circuit board described above is connected to an additional structure (such as a third circuit board or other electronic components) or to the first circuit board, which is not limited in the embodiments of the present disclosure.

As shown in FIG. 10, FIG. 10 is a schematic diagram of a structure of the first substrate connection pad in the first circuit board shown in FIG. 5. FIG. 11 is a schematic diagram of a sectional structure (at a sectional position A-A) of the first substrate connection pad shown in FIG. 10.

The first substrate connection pad 213a includes at least two substrate connection terminals disposed on the first side c1 of the first substrate 211. The at least two substrate connection terminals include a first substrate connection terminal d1 electrically connected to the first wire s1, and a second substrate connection terminal d2 disposed at the first via hole k1. The second substrate connection terminal d2 is electrically connected to the second wire s2. As shown in FIG. 10, the first substrate connection terminal d1 is connected to a wire, and the second substrate connection terminal d2 is not connected to a wire, thereby saving space on the first substrate. In this way, a size of the first substrate connection terminal d1 and a size of the second substrate connection terminal d2 are larger, and sizes of the conductive portions subsequently arranged on the first substrate connection terminal d1 and second substrate connection terminal d2 are larger, thereby improving the robustness of the connections between the first circuit board and the conductive portions.

FIG. 11 is a schematic diagram of a structure of a substrate connection terminal. However, in the circuit board according to some embodiment of the present disclosure, the substrate connection terminals have other structures. For example, as shown in FIG. 11, it is a schematic diagram of a sectional structure (at a section position A-A) of the first substrate connection pad shown in FIG. 10. The second substrate connection terminal d2 includes a conductive structure d21 surrounding the first via hole k1 and a metal layer d22 covering the conductive structure d21 and the first via hole k1. The conductive structure 21 is disposed on the first substrate 211, and the conductive structure d21 and the first wire s1 are at the same layer. In some embodiments, the metal layer d22 is formed by electroplating processes. For example, the metal layer d22 is a copper metal layer, or other metal layer with strong electrical conductivity. The substrate connection terminal is referred to as a soldering pad.

Furthermore, in some embodiments, the first substrate connection terminal d1 includes a conductive structure d11 and a metal layer d12 disposed on the conductive structure d11, wherein the conductive structure d11 and the first wire s1 are at the same layer, and the metal layer d12 and the metal layer d22 in the second substrate connection terminal d2 are at the same layer. Similarly, in some embodiments, the first wire s1 is provided with a metal layer that is on the same layer as the metal layer d12.

FIG. 12 is a schematic diagram of a sectional structure (at a sectional position D-D) of the structure shown in FIG. 7. Refer to FIG. 7 and FIG. 12, at least two wires in the second circuit board include a third wire s3 disposed on a third side c3 of the second substrate 221 and a fourth wire s4 disposed on a fourth side c4 of the second substrate 221. The third side c3 and the fourth side c4 are two opposite sides of the second substrate 221, and the third side c3 is a side of the second substrate 221 facing the first substrate 211.

The second substrate is provided with a second via hole k2, wherein the first relay connection pad is electrically connected to the fourth wire s4 via the second via hole k2.

In some embodiments, the second via hole k2 has a number of at least two. The first relay connection pad 223a includes relay connection terminals z disposed at the second via holes k2, and the third wire s3 and the fourth wire s4 are respectively electrically connected to two of the relay connection terminals z at the second via holes k2.

As shown in FIG. 7, some of the relay connection terminals z are not connected to the wires, and the wires connected to these relay connection terminals are disposed on the other side of the second substrate 221. With such a structure, the space on the second substrate 221 is saved, such that the size of each relay connection terminal z is larger, and the size of the subsequently arranged conductive portion for connection is larger, thereby improving the robustness of the connections between the second circuit board and the conductive portions.

It should be noted that the description that the first circuit board is connected to the second circuit board via the conductive portions means that the substrate connection terminals in the first circuit board and the relay connection terminals in the second circuit board are both electrically connected to the conductive portions. Each of the conductive portions includes a plurality of conductive sub-portions, and one substrate connection terminal is electrically connected to one relay connection terminal via one conductive sub-portion.

In some embodiments, each of the relay connection terminals z includes a first conductive layer z1 disposed on a hole wall of the second via hole k2, and second conductive layers z2 extending from openings of the second via hole k2 to the second substrate 221. The first conductive layer z1 is connected to the second conductive layers z2. The second via hole k2 has an opening on each of the third side c3 and the fourth side c4 of the second substrate 221. The first conductive layer z1 starts from these two openings, and extends to form the second conductive layers z2 on both surfaces of the second substrate 221. In some embodiments, the first conductive layer z1 and the second conductive layers z2 are made of metal materials, such as copper, silver, aluminum or the like.

FIG. 12 shows a structure where the wires included in the at least two wires in the second circuit board are disposed on both sides of the second substrate. However, in some embodiments, the at least two wires in the second circuit board are disposed on one side of the second substrate. That is, the at least two wires in the second circuit board include a fifth wire disposed on a third side of the second substrate or a fourth side of the second substrate, the fifth wire being electrically connected to the first relay connection pad.

Referring to FIG. 12, in some embodiments, one conductive sub-portion 23a1 in the first conductive portion 23a is in contact with the first substrate connection pad 213a, and the conductive sub-portion 23a1 is at least partially filled in the second via hole k2 and in contact with the relay connection terminal z at the second via hole k2. With such a structure in which the via hole is provided and the conductive portion is partially filled in this via hole, the robustness of the connection between the conductive portion and the second substrate is increased, thereby reducing the possibility of separation between the conductive portion and the second substrate, and improving the reliability of the circuit board. In some embodiments, the conductive sub-portion 23a1 is soldering tin.

Referring to FIG. 5, the number of the wire group is at least two, and the number of the conductive portion (not shown in FIG. 4) is at least two.

The first circuit board 21 further includes a second substrate connection pad 213b disposed on the first substrate 211. A second wire group 212b in the at least two wire groups includes a sixth wire disposed on the first side of the first substrate and a seventh wire disposed on the second side of the first substrate. The sixth wire is electrically connected to the second substrate connection pad, the first substrate is provided with a third via hole, and the seventh wire is electrically connected to the second substrate connection pad via the third via hole. The second wire group and the second substrate connection pad are similar in structure to the first wire group and the first substrate connection pad as described above. And for the structures of the sixth wire, the seventh wire and the third via hole, a reference is made to the first wire and the second wire in the first wire group and the first via hole as shown in FIG. 12, which are not repeated in the embodiments of the present disclosure.

Referring to FIG. 4, the second circuit board 22 further includes a second relay connection pad 223b disposed on the second substrate 221. The other end of each of the at least two wires 223 is electrically connected to the second relay connection pad 223b, and the second relay connection pad 223b is electrically connected to the second substrate connection pad via a second conductive portion in the at least two conductive portions. The structure that the second relay connection pad is electrically connected to the second substrate connection pad via the second conductive portion is similar to the structure that the first relay connection pad is electrically connected to the first substrate connection pad via the first conductive portion as shown in FIG. 12, and a reference is made to the description in the above embodiment with respect to FIG. 12, which is not repeated here in the embodiments of the present disclosure.

In addition, referring to FIG. 4, the circuit board according to the embodiment of the present disclosure further includes a control assembly IC, a touch trace s10 and a circuit component Co. One end of the touch trace s10 is electrically connected to a touch electrode layer in a display panel, and the other end of the touch trace is electrically connected to the control assembly IC. In some embodiments, the control assembly IC is a touch integrated circuit. The control assembly IC is electrically connected to the first wire group 212a. A wire is led from the circuit element Co to extend on the first substrate 211 and pass through a gap between the second circuit board 22 and the first substrate 211.

In some embodiments, at least one of the substrate connection pad and the relay connection pad is a ball-grid-array connection pad. The connection pad in such a structure is able to include more connection terminals.

Furthermore, referring to FIG. 13, FIG. 13 is a schematic diagram of another sectional structure (at a section position E-E) of the structure shown in FIG. 10. The first circuit board 21 includes a first insulation layer 215 disposed on the first side of the first substrate 211, and an eighth wire s8 disposed between the first insulation layer 215 and the first substrate 211. The first insulation layer 215 is provided with a fourth via hole k4, and the eighth wire s8 is electrically connected to the first substrate connection pad 213a via the fourth via hole. FIG. 13 provides another structure in which the trace on one side of the first substrate provided with the substrate connection pad through multilayer traces. That is, the circuit board provided in the embodiments of the present disclosure is able to be combined with a multilayer trace structure. In the circuit board according to the embodiments of the present disclosure, the first substrate connection pad and the wire are connected with at least one of the structure shown in FIG. 13 and the structure shown in FIG. 11.

In some embodiments, the first substrate in the first circuit board and the second substrate in the second circuit board are both flexible substrates. Then, the first circuit board and the second circuit board are both flexible printed circuit (FPC) boards in some embodiments.

In summary, the embodiment of the present disclosure provides a circuit board, and wires on both sides of the first substrate of the circuit board are electrically connected to the substrate connection pad on the first substrate to reduce an area occupied by the wire on the side where the substrate connection pad on the first substrate is disposed, such that a larger area is left on the substrate connection pad for disposing the conductive portion. In such a way, the connection stability between the first circuit board and the second circuit board is improved, and the problem of low reliability of the circuit board in related technologies is solved, thereby improving the reliability of the circuit board.

FIG. 14 is a schematic diagram of a structure of a display apparatus according to some embodiments of the present disclosure. The display apparatus includes a display panel 10 and a circuit board 20. The circuit board 20 is any one of the circuit boards as defined in the above embodiments.

The circuit board 20 is provided with a plurality of wires, wherein the wires are electrically connected to the display panel 10 to control the display panel to achieve various functions, such as a display function, a touch function or the like.

In some embodiments, the display panel 10 includes a base substrate, a light-emitting structure layer disposed on the base substrate, and a touch electrode layer disposed on the light-emitting structure layer, wherein the touch electrode layer is electrically connected to the circuit board 20. Hence, the circuit board 20 is able to control the touch electrode layer to achieve a touch function. In some embodiments, the display panel is an organic light-emitting diode display panel, or a liquid crystal display panel, which is not limited in the embodiments of the present disclosure.

In some embodiments, the touch electrode layer is a touch structure to which a flexible multi-layer on cell (FMLOC) technology is applied. The flexible multilayer structure includes a metal grid electrode layer disposed on the display panel, and the metal grid electrode layer is taken as a touch electrode to achieve touch control. In such a way, there is no need to mount an external touch panel outside the display panel. With the flexible multilayer structure, the thickness of the display apparatus is reduced, while there is no fit tolerance between the touch panel and the display panel.

Some embodiments of the present disclosure show a schematic diagram of a structure of the circuit board including a second circuit board, but the number of the second circuit boards are more in some embodiments, such as 2, 3, 4, 5, 6 or more. Accordingly, the number of the substrate connection pads on the first circuit board is also greater.

In summary, the embodiment of the present disclosure provides a display apparatus including a display panel and a circuit board, and wires on both sides of a first substrate of the circuit board are electrically connected to a substrate connection pad on the first substrate to reduce an area occupied by the wire on the side where the substrate connection pad on the first substrate is disposed, such that a larger area is left on the substrate connection pad for disposing the conductive portion. In such a way, the connection stability between the first circuit board and the second circuit board is improved, and the problem of low reliability of the circuit board in related technologies is solved, thereby improving the reliability of the display apparatus.

It should be noted that the substrate connection pad, the relay connection pad or the like involved in the embodiments of the present disclosure are intended only to distinguish the different names of the connection pads, and are not intended to limit the connection pads themselves.

FIG. 15 is a flowchart of a method for manufacturing a circuit board according to some embodiments of the present disclosure. The method includes the following processes.

In 101, a first circuit board is provided.

The first circuit board includes a first substrate, at least one wire group and at least one substrate connection pad, wherein a first wire group in the at least one wire group includes a first wire disposed on a first side of the first substrate and a second wire disposed on a second side of the first substrate. The at least one substrate connection pad is disposed on the first side of the first substrate, and the first wire is electrically connected to a first substrate connection pad in the at least one substrate connection pad. The first substrate is provided with a first via hole, wherein the first substrate connection pad is electrically connected to the second wire via the first via hole. The first side and the second side are two opposite sides of the first substrate.

In 102, a second circuit board is provided.

The second circuit board includes a second substrate, at least two wires and at least one relay connection pad, wherein the at least two wires and the at least one relay connection pad are disposed on the second substrate. One end of each of the at least two wires is electrically connected to the first relay connection pad in the at least one relay connection pad.

In 103, the second circuit board is stacked on the first circuit board, and the first relay connection pad is electrically connected to a first substrate connection pad via at least one conductive portion, wherein the second substrate is disposed on the first side of the first substrate.

In summary, the embodiment of the present disclosure provides a method for manufacturing the circuit board, and wires on both sides of a first substrate of the circuit board are electrically connected to a substrate connection pad on the first substrate to reduce an area occupied by the wire on the side where the substrate connection pad on the first substrate is disposed, such that a larger area is left on the substrate connection pad for disposing the conductive portion. In such a way, the connection stability between the first circuit board and the second circuit board is improved, and the problem of low reliability of the circuit board in related technologies is solved, thereby improving the reliability of the circuit board.

In some embodiments, process 101 above includes:

1. Providing an initial circuit board, wherein the initial circuit board includes a first substrate and conductive layers disposed on both sides of the first substrate;
2. patterning the conductive layers disposed on both sides of the first substrate to form a first wire disposed on the first side of the first substrate and a second wire disposed on the second side of the first substrate;
3. forming a first via hole on the first side of the first substrate such that the second wire is exposed from the first via hole; and
4. forming a metal plating on the first substrate to cover the wire on the first side and the first via hole, wherein the metal plating is electrically connected to the second wire exposed at the first via hole. In some embodiments, the metal plating is formed by electroplating processes.

In some embodiments, after the circuit board is manufactured by the method provided in the embodiments of the present disclosure, the circuit board is connected to a display panel to constitute a display apparatus.

The term "at least one of A and B" in the present disclosure is intended only to describe an association relationship between associated objects, indicating the possibility of three types of relationships. For example, at least one of A and B indicates the following three cases: A exists alone, A and B exist concurrently, and B exists alone. Likewise, "at least one of A, B, and C" indicates the possibility of seven types of relationships, which indicates the following seven cases: A exists alone, B exists alone, C exists alone, A and B exist concurrently, A and C exist concurrently, and C and B exist concurrently, and A, B and C exist concurrently. Likewise, "at least one of A, B, C, and D" indicates the possibility of fifteen types of relationships, which indicates the following fifteen cases: A exists alone, B exists alone, C exists alone, D exists alone, A and B exist concurrently, A and C exist concurrently, A and D exist concurrently, C and B exist concurrently, D and B exist concurrently, C and D exist concurrently, A, B and C exist concurrently, A, B and D exist concurrently, A, C and D exist concurrently, B, C, and D exist concurrently, and A, B, C, and D exist concurrently.

It should be noted that, in the accompanying drawings, the size of layer and region are exaggerated for clarity of illustration. Moreover, it should be understood that when a component or layer is referred to as being "on" another component or layer, this component or layer is directly on the other component or an intervening layer is present. In addition, it should be understood that when a component or layer is referred to as being "under" another component or layer, this component or layer is directly under the other component, or more than one intervening layer or component is present. In addition, it should be further understood that when a layer or element is referred to as being "between" two layers or two elements, the layer or element is a unique layer between the two layers or two elements, or more than one intervening layer or element is present. Similar reference signs indicate similar elements throughout the whole text.

In the present disclosure, the terms "first," "second," "third," "fourth," . . . , "eighth" are for descriptive purposes only and are not to be construed as indicating or implying relative importance. The term "a plurality of" means two or more in number, unless otherwise stated.

Described above are merely optional embodiments of the present disclosure, and are not intended to limit the present disclosure. Within the spirit and principles of the present disclosure, any modifications, equivalent substitutions, improvements, and the like should be included within the scope of protection of the present disclosure.

What is claimed is:

1. A circuit board, comprising a first circuit board, at least one second circuit board and at least one conductive portion, wherein the first circuit board comprises a first substrate, at least one wire group and at least one substrate connection pad, wherein a first wire group in the at least one wire group comprises a first wire disposed on a first side of the first substrate and a second wire disposed on a second side of the first substrate, the at least one substrate connection pad is disposed on the first side of the first substrate, the first wire is electrically connected to a first substrate connection pad in the at least one substrate connection pad, the first substrate is provided with a first via hole, the first substrate connection pad is electrically connected to the second wire via the first via hole, and the first side and the second side are two opposite sides of the first substrate; and the second circuit board comprises a second substrate, at least two wires and at least one relay connection pad, wherein the least two wires and the at least one relay connection pad are disposed on the second substrate, the second substrate is disposed on the first side of the first substrate, one end of each of the at least two wires is electrically connected to a first relay connection pad in the at least one relay connection pad, and the first relay connection pad is electrically connected to the first substrate connection pad via a first conductive portion in the at least one conductive portion.

2. The circuit board according to claim 1, wherein the first substrate connection pad comprises at least two substrate connection terminals disposed on the first side of the first substrate; wherein the at least two substrate connection terminals comprise a first substrate connection terminal electrically connected to the first wire, and a second substrate connection terminal disposed at the first via hole, the second substrate connection terminal being electrically connected to the second wire.

3. The circuit board according to claim 2, wherein the second substrate connection terminal comprises a conductive structure surrounding the first via hole and a metal layer covering the conductive structure and the first via hole, wherein the conductive structure is disposed on the first substrate, and the conductive structure and the first wire are at the same layer.

4. The circuit board according to claim 1, wherein the at least two wires comprise a third wire disposed on a third side of the second substrate and a fourth wire disposed on a fourth side of the second substrate, wherein the third side and the fourth side are two opposite sides of the second substrate, and the third side is a side of the second substrate facing the first substrate; and the second substrate is provided with a second via hole, wherein the first relay connection pad is electrically connected to the fourth wire via the second via hole.

5. The circuit board according to claim 4, wherein the second via hole has a number of at least two; the first relay connection pad comprises relay connection terminals disposed at the second via holes; and the third wire and the fourth wire are respectively electrically connected to two of the relay connection terminals at the second via holes.

6. The circuit board according to claim 5, wherein each of the relay connection terminals comprises a first conductive layer disposed on a hole wall of the second via hole, and second conductive layers extending from openings of the second via hole to the second substrate, the first conductive layer being connected to the second conductive layers.

7. The circuit board according to claim 6, wherein the first conductive portion is in contact with the first substrate connection pad, and the first conductive portion is at least partially filled in the second via hole.

8. The circuit board according to claim 1, wherein the at least two wires comprise a fifth wire disposed on a third side of the second substrate or a fourth side of the second substrate; wherein the third side and the fourth side are two opposite sides of the second substrate, the third side is a side of the second substrate facing the first substrate, and the fifth wire is electrically connected to the first relay connection pad.

9. The circuit board according to claim 1, wherein the wire group has a number of at least two; and the conductive portion has a number of at least two;

the first circuit board further comprises a second substrate connection pad disposed on the first substrate, a second wire group in the at least two wire groups comprises a sixth wire disposed on the first side of the first substrate and a seventh wire disposed on the second side of the first substrate, wherein the sixth wire is electrically connected to the second substrate connection pad, the first substrate is provided with a third via hole, and the seventh wire is electrically connected to the second substrate connection pad via the third via hole; and the second circuit board further comprises a second relay connection pad disposed on the second substrate, wherein the other end of each of the at least two wires is electrically connected to the second relay connection pad, and the second relay connection pad is electrically connected to the second substrate connection pad via a second conductive portion in the at least two conductive portions.

10. The circuit board according to claim 1, wherein the first circuit board comprises a first insulation layer disposed on the first side of the first substrate, and an eighth wire disposed between the first insulation layer and the first substrate, wherein the first insulation layer is provided with a fourth via hole, and the eighth wire is electrically connected to the first substrate connection pad via the fourth via hole.

11. The circuit board according to claim 1, wherein at least one of the substrate connection pad and the relay connection pad is a ball-grid-array connection pad.

12. The circuit board according to claim 1, wherein the first substrate and the second substrate are both flexible substrates.

13. A display apparatus, comprising a display panel and a circuit board, wherein the display panel is electrically connected to the circuit board, the circuit board comprises a first circuit board, at least one second circuit board and at least one conductive portion, wherein the first circuit board comprises a first substrate, at least one wire group and at least one substrate connection pad, wherein a first wire group in the at least one wire group comprises a first wire disposed on a first side of the first substrate and a second wire disposed on a second side of the first substrate, the at least one substrate connection pad is disposed on the first side of the first substrate, the first wire is electrically connected to a first substrate connection pad in the at least one substrate connection pad, the first substrate is provided with a first via hole, the first substrate connection pad is electrically connected to the second wire via the first via hole, and the first side and the second side are two opposite sides of the first substrate; and the second circuit board comprises a second substrate, at least two wires and at least one relay connection pad, wherein the least two wires and the at least one relay connection pad are disposed on the second substrate, the second substrate is disposed on the first side of the first substrate, one end of each of the at least two wires is electrically connected to a first relay connection pad in the at least one relay connection pad, and the first relay connection pad is electrically connected to the first substrate connection pad via a first conductive portion in the at least one conductive portion.

14. The display apparatus according to claim 13, wherein the display panel comprises a base substrate, a light-emitting structure layer disposed on the base substrate, and a touch electrode layer disposed on the light-emitting structure layer, wherein the touch electrode layer is electrically connected to the circuit board.

15. The display apparatus according to claim 13, wherein the at least two wires comprise a third wire disposed on a third side of the second substrate and a fourth wire disposed on a fourth side of the second substrate, wherein the third side and the fourth side are two opposite sides of the second substrate, and the third side is a side of the second substrate facing the first substrate; and the second substrate is provided with a second via hole, wherein the first relay connection pad is electrically connected to the fourth wire via the second via hole.

16. The display apparatus according to claim 15, wherein the second via hole has a number of at least two; the first relay connection pad comprises relay connection terminals disposed at the second via holes; and the third wire and the fourth wire are respectively electrically connected to two of the relay connection terminals at the second via holes.

17. The display apparatus according to claim 16, wherein each of the relay connection terminals comprises a first conductive layer disposed on a hole wall of the second via hole, and second conductive layers extending from openings of the second via hole to the second substrate, the first conductive layer being connected to the second conductive layers.

18. A method for manufacturing a circuit board, comprising:

providing a first circuit board, wherein the first circuit board comprises a first substrate, at least one wire group and at least one substrate connection pad, wherein a first wire group in the at least one wire group comprises a first wire disposed on a first side of the first substrate and a second wire disposed on a second side of the first substrate, the at least one substrate connection pad is disposed on the first side of the first substrate, the first wire is electrically connected to a first substrate connection pad in the at least one substrate connection pad, the first substrate is provided with a first via hole, the first substrate connection pad is electrically connected to the second wire via the first via hole, and the first side and the second side are two opposite sides of the first substrate;

providing a second circuit board, wherein the second circuit board comprises a second substrate, at least two wires and at least one relay connection pad, wherein the least two wires and the at least one relay connection pad are disposed on the second substrate, and one end of each of the at least two wires is electrically connected to the first relay connection pad in the at least one relay connection pad; and stacking the second circuit board on the first circuit board, and electrically connecting the first relay connection pad to the first substrate connection pad via at least one conductive portion, wherein the second substrate is disposed on the first side of the first substrate.

19. The display apparatus according to claim 13, wherein the first substrate connection pad comprises at least two substrate connection terminals disposed on the first side of the first substrate; wherein the at least two substrate connection terminals comprise a first substrate connection terminal electrically connected to the first wire, and a second substrate connection terminal disposed at the first via hole, the second substrate connection terminal being electrically connected to the second wire.

20. The display apparatus according to claim 19, wherein the second substrate connection terminal comprises a conductive structure surrounding the first via hole and a metal layer covering the conductive structure and the first via hole, wherein the conductive structure is disposed on the first substrate, and the conductive structure and the first wire are at the same layer.

* * * * *